US012580524B2

(12) United States Patent
Balteanu et al.

(10) Patent No.: US 12,580,524 B2
(45) Date of Patent: Mar. 17, 2026

(54) APPARATUS AND METHODS FOR BIASING OF LOW NOISE AMPLIFIERS

(71) Applicant: Skyworks Solutions, Inc., Irvine, CA (US)

(72) Inventors: Florinel G. Balteanu, Irvine, CA (US); Wei Liu, Irvine, CA (US); Abhishekh Devaraj, Irvine, CA (US); Sachin Nagarajan, Irvine, CA (US); Kiran Tej Thoomu, Irvine, CA (US); Christopher Song, Norwalk, CA (US); Yunyoung Choi, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 695 days.

(21) Appl. No.: 17/811,656

(22) Filed: Jul. 11, 2022

(65) Prior Publication Data

US 2023/0023111 A1     Jan. 26, 2023

Related U.S. Application Data

(60) Provisional application No. 63/203,369, filed on Jul. 20, 2021.

(51) Int. Cl.
  *H03F 1/26* (2006.01)
  *H03F 3/193* (2006.01)
  *H03G 3/30* (2006.01)

(52) U.S. Cl.
  CPC .............. *H03F 1/26* (2013.01); *H03F 3/193* (2013.01); *H03G 3/30* (2013.01); *H03F 2200/294* (2013.01)

(58) Field of Classification Search
  CPC ...... H03F 1/26; H03F 3/193; H03F 2200/294; H03F 3/72; H03F 2200/451; H03F 1/0211; H03F 1/223; H03G 3/30
  (Continued)

(56) References Cited

U.S. PATENT DOCUMENTS

| | | | |
|---|---|---|---|
| 5,317,173 A | 5/1994 | Sovero | |
| 5,646,573 A | 7/1997 | Bayruns et al. | |

(Continued)

FOREIGN PATENT DOCUMENTS

| | | |
|---|---|---|
| CN | 109150116 | 1/2019 |
| JP | 2013-038608 | 2/2013 |

OTHER PUBLICATIONS

P. Malcovati, F. Maloberti, M. Pruzzi, and C. Fiocchi, Curvature Compensated BiCMOS Bandgap with 1 V Supply Voltage, May 2000, ResearchGate, DOI: 10.1109/ESSCIR.2000.186441, all pages. (Year: 2000).*

*Primary Examiner* — Andrea Lindgren Baltzell
*Assistant Examiner* — Jose E Pinero
(74) *Attorney, Agent, or Firm* — Knobbe, Martens, Olson & Bear, LLP

(57)     ABSTRACT

Apparatus and methods for biasing of low noise amplifiers (LNAs) are provided herein. In certain embodiments, an LNA includes at least one transistor that amplifies a radio frequency (RF) input signal, and a bias circuit including a current bias circuit that generates a bias current based on a reference current and a voltage bias circuit that generates at least one input bias voltage for the at least one transistor based on the bias current. The current bias circuit includes a first bias transistor that receives the reference current, a second bias transistor that generates the bias current, and an amplifier that controls a first bias voltage of the first bias transistor to match a second bias voltage of the second bias transistor.

20 Claims, 18 Drawing Sheets

(58) Field of Classification Search
USPC ........................................................ 330/108
See application file for complete search history.

(56) References Cited

U.S. PATENT DOCUMENTS

| 5,774,017 | A | 6/1998 | Adar |
| 6,242,986 | B1 | 6/2001 | Adar |
| 6,501,331 | B2 | 12/2002 | Adar |
| 6,515,546 | B2 | 2/2003 | Liwinski |
| 6,842,075 | B2 | 1/2005 | Johnson et al. |
| 7,471,154 | B2 | 12/2008 | Thompson |
| 7,482,868 | B2 | 1/2009 | Hageman et al. |
| 7,493,097 | B2 | 2/2009 | Ismail et al. |
| 8,497,736 | B1 | 7/2013 | Leipold et al. |
| 8,717,101 | B2 | 5/2014 | Li et al. |
| 9,136,803 | B2 | 9/2015 | Li et al. |
| 9,294,073 | B2 | 3/2016 | Homol et al. |
| 9,667,200 | B2 | 5/2017 | Ripley |
| 9,667,203 | B2 | 5/2017 | Li et al. |
| 9,917,549 | B1 | 3/2018 | Allen |
| 9,917,563 | B2 | 3/2018 | Li et al. |
| 10,003,308 | B2 | 6/2018 | Lam |
| 10,014,886 | B2 | 7/2018 | Whittaker et al. |
| 10,284,160 | B2 | 5/2019 | Lee |
| 10,381,990 | B2 | 8/2019 | Allen |
| 10,389,305 | B2 * | 8/2019 | Lee ...................... H03G 1/0029 |
| 10,419,042 | B2 | 9/2019 | Whittaker et al. |
| 10,469,045 | B2 | 11/2019 | Lee |
| 10,566,943 | B2 | 2/2020 | Li et al. |
| 2009/0108939 | A1 | 4/2009 | Oishi |
| 2011/0130109 | A1 | 6/2011 | Ogasawara |
| 2017/0141734 | A1 | 5/2017 | Lehtola et al. |
| 2018/0331661 | A1 | 11/2018 | Lam |
| 2020/0036403 | A1 | 1/2020 | Whittaker et al. |

* cited by examiner mXn DL MIMO nXm UL MIMO

APPARATUS AND METHODS FOR BIASING OF LOW NOISE AMPLIFIERS

CROSS-REFERENCE TO RELATED APPLICATIONS

This application claims the benefit of priority under 35 U.S.C. § 119 of U.S. Provisional Patent Application No. 63/203,369, filed Jul. 20, 2021 and titled "APPARATUS AND METHODS FOR BIASING OF LOW NOISE AMPLIFIERS," which is herein incorporated by reference in its entirety.

BACKGROUND

Technical Field

Embodiments of the invention relate to electronic systems, and in particular, to radio frequency (RF) electronics.

Description of Related Technology

A low noise amplifier (LNA) can be used to boost the amplitude of a relatively weak radio frequency (RF) signal received via an antenna. Thereafter, the boosted RF signal can be used for a variety of purposes, including, for example, driving a switch, a mixer, and/or a filter in an RF communication system.

Examples of RF communication systems with one or more LNAs include, but are not limited to, mobile phones, tablets, base stations, network access points, customer-premises equipment (CPE), laptops, and wearable electronics.

LNAs can be included in RF communication systems to amplify signals of a wide range of frequencies. For example, an LNA can be used to provide low noise amplification to RF signals in a frequency range of about 30 kHz to 300 GHz, such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

SUMMARY

In certain embodiments, the present disclosure relates to a mobile device. The mobile device includes an antenna and a front-end system that includes a low noise amplifier including at least one amplification transistor configured to amplify a radio frequency input signal received from the antenna, and a biasing circuit including a current bias circuit configured to generate a bias current based on a reference current and a voltage bias circuit configured to generate at least one input bias voltage for the at least one amplification transistor based on the bias current. The current bias circuit includes a first bias transistor configured to receive the reference current, a second bias transistor configured to generate the bias current, and an amplifier configured to control a first bias voltage of the first bias transistor to match a second bias voltage of the second bias transistor.

In various embodiments, the current bias circuit further includes a plurality of selection switches and a plurality of current mirroring transistors each selectable by a corresponding one of the plurality of selection switches, the plurality of current mirroring transistors biased by the second bias voltage.

In several embodiments, the first bias transistor includes a drain connected to a first input of the amplifier and a gate connected to an output of the amplifier, and the second bias transistor includes a drain connected to a second input of the amplifier and a gate connected to the output of the amplifier.

In some embodiments, the at least one amplification transistor includes a common source transistor, and the at least one input bias voltage includes a gate bias voltage for the common source transistor. According to a number of embodiments, the biasing circuit includes a bias resistor and a bias resistor bypass switch, the voltage bias circuit configured to provide the gate bias voltage to a gate of the common source transistor through a parallel combination of the bias resistor and the bias resistor bypass switch. In accordance with various embodiments, the at least one amplification transistor further includes a cascode transistor in series with the common source transistor, and the at least one input bias voltage further includes a cascode bias voltage for the cascode transistor.

In several embodiments, the front-end systems further includes a controllable current source configured to generate the reference current, the controllable current source configured to control the reference current based on a gain control signal.

In various embodiments, the voltage bias circuit further includes a first voltage bias transistor and a resistor in series between a supply voltage and a ground voltage, and a second voltage bias transistor and a third voltage bias transistor in series between a gate of the first voltage bias transistor and the ground voltage. According to a number of embodiments, the voltage bias circuit is configured to generate a first input bias voltage of the at least one input bias voltage based on a voltage across the resistor, and to generate a second input bias voltage of the at least one input bias voltage based on a gate voltage of the second voltage bias transistor.

In certain embodiments, the present disclosure relates to a low noise amplifier includes at least one amplification transistor configured to amplify a radio frequency input signal, and a biasing circuit including a current bias circuit configured to generate a bias current based on a reference current and a voltage bias circuit configured to generate at least one input bias voltage for the at least one amplification transistor based on the bias current. The current bias circuit including a first bias transistor configured to receive the reference current, a second bias transistor configured to generate the bias current, and an amplifier configured to control a first bias voltage of the first bias transistor to match a second bias voltage of the second bias transistor.

In various embodiments, the current bias circuit further includes a plurality of selection switches and a plurality of current mirroring transistors each selectable by a corresponding one of the plurality of selection switches, the plurality of current mirroring transistors biased by the second bias voltage.

In several embodiments, the first bias transistor includes a drain connected to a first input of the amplifier and a gate connected to an output of the amplifier, and the second bias transistor includes a drain connected to a second input of the amplifier and a gate connected to the output of the amplifier.

In some embodiments, the at least one amplification transistor includes a common source transistor, and the at least one input bias voltage includes a gate bias voltage for the common source transistor. According to a number of embodiments, the biasing circuit includes a bias resistor and a bias resistor bypass switch, the voltage bias circuit configured to provide the gate bias voltage to a gate of the common source transistor through a parallel combination of the bias resistor and the bias resistor bypass switch. In accordance with several embodiments, the at least one amplification transistor further includes a cascode transistor in series with the common source transistor, and the at least one input bias voltage further includes a cascode bias voltage for the cascode transistor.

In various embodiments, the low noise amplifier further includes a controllable current source configured to generate the reference current, the controllable current source configured to control the reference current based on a gain control signal.

In several embodiments, the voltage bias circuit includes a first voltage bias transistor and a resistor in series between a supply voltage and a ground voltage, and a second voltage bias transistor and a third voltage bias transistor in series between a gate of the first voltage bias transistor and the ground voltage. According to a number of embodiments, the voltage bias circuit is configured to generate a first input bias voltage of the at least one input bias voltage based on a voltage across the resistor, and to generate a second input bias voltage of the at least one input bias voltage based on a gate voltage of the second voltage bias transistor.

In certain embodiments, the present disclosure relates to a method of radio frequency signal amplification. The method includes amplifying a radio frequency input signal using at least one amplification transistor of a low noise amplifier, generating at least one input bias voltage for the at least one amplification transistor based on a bias current using a voltage bias circuit of the low noise amplifier, and generating the bias current based on a reference current using a current bias circuit of the low noise amplifier, including receiving the reference current using a first bias transistor, generating the bias current using a second bias transistor, and controlling a first bias voltage of the first bias transistor to match a second bias voltage of the second bias transistor using an amplifier.

In some embodiments, controlling the first bias voltage of the first bias transistor to match the second bias voltage of the second bias transistor includes controlling a drain-to-source voltage of the first bias transistor to substantially equal a drain-to-source voltage of the second bias transistor.

In several embodiments, generating the at least one input bias voltage for the at least one amplification transistor including generating a gate bias voltage for a common source transistor and generating a cascode bias voltage for a cascode transistor that is in series with the common source transistor.

BRIEF DESCRIPTION OF THE DRAWINGS

Embodiments of this disclosure will now be described, by way of non-limiting example, with reference to the accompanying drawings.

4

Figure 3A:
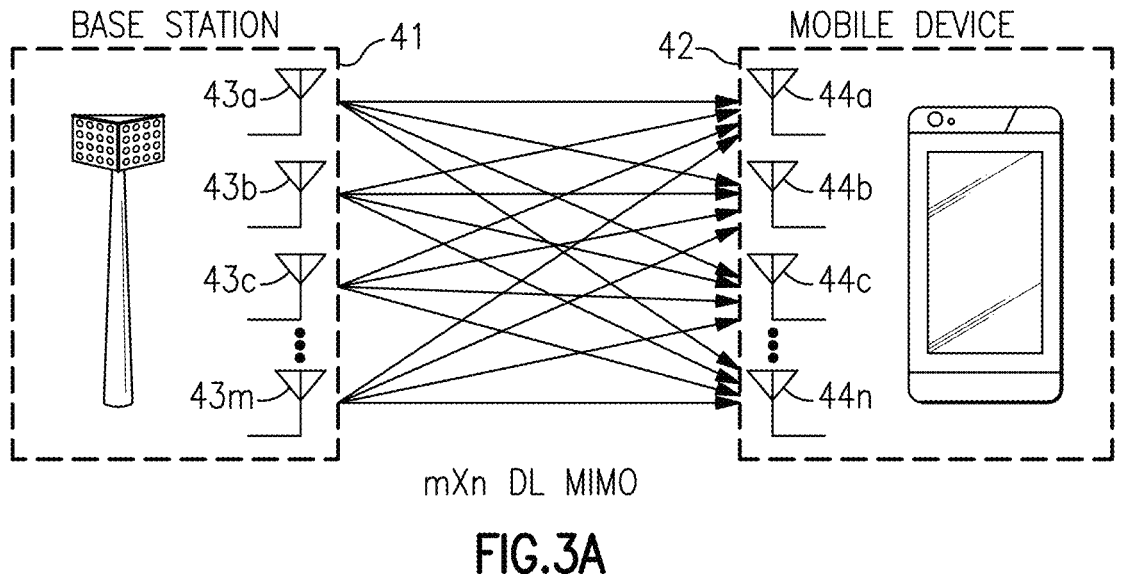
FIG. 3A is a schematic diagram of one example of a downlink channel using multi-input and multi-output (MIMO) communications.
Figure 3B:
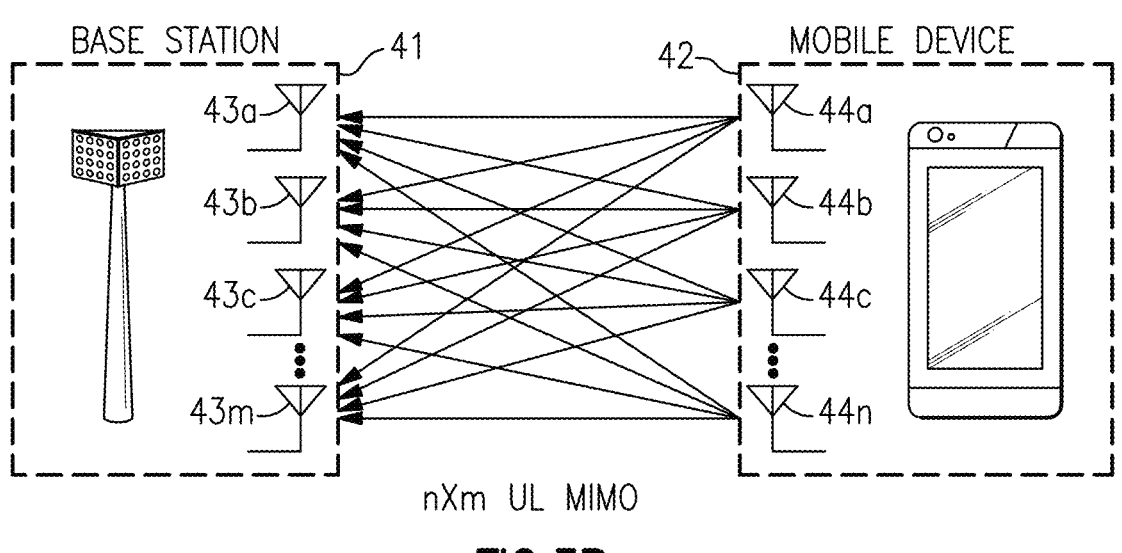
FIG. 3B is schematic diagram of one example of an uplink channel using MIMO communications.
Figure 3C:
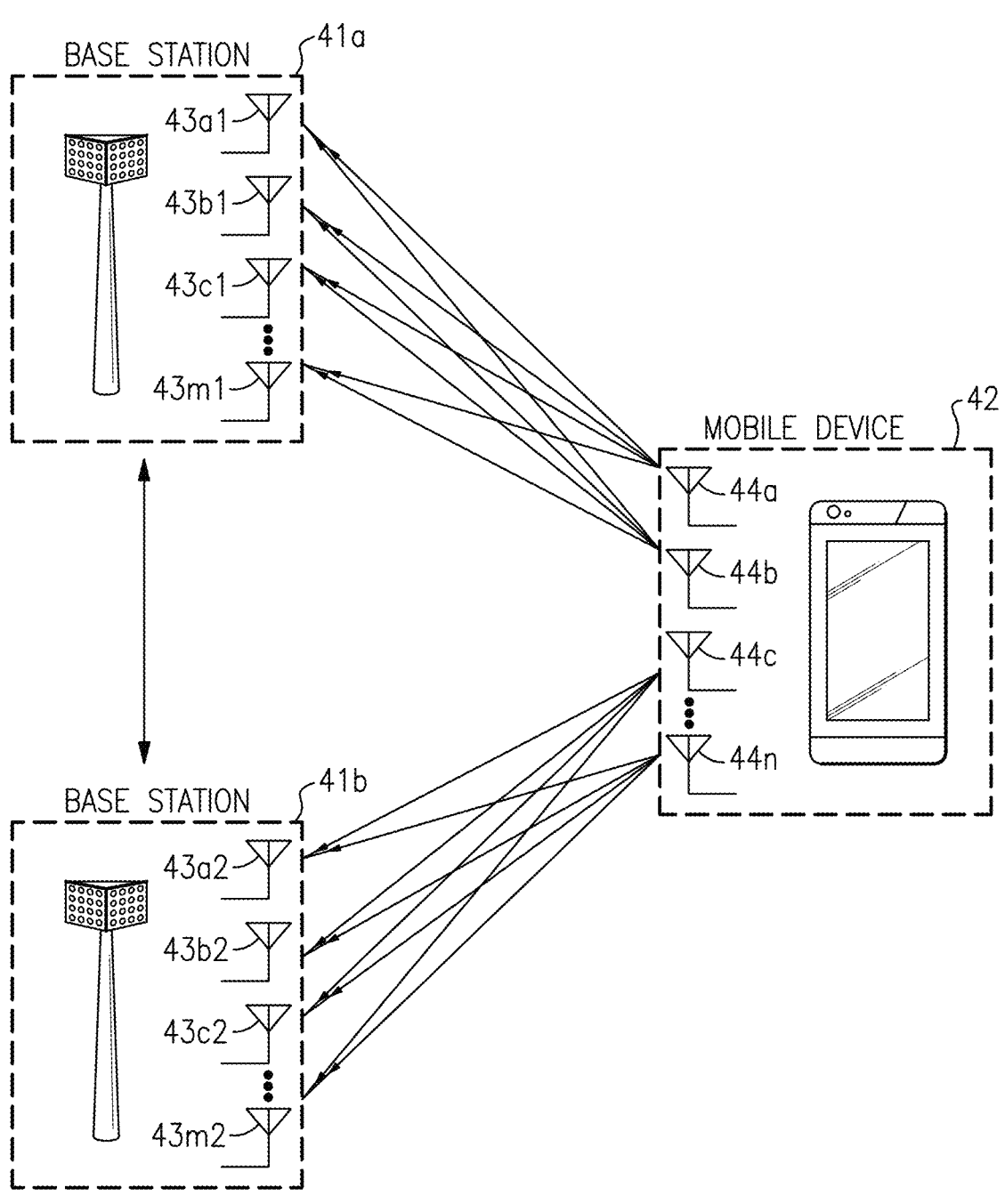

FIG. 3C is schematic diagram of another example of an uplink channel using MIMO communications.

Figure 4A:
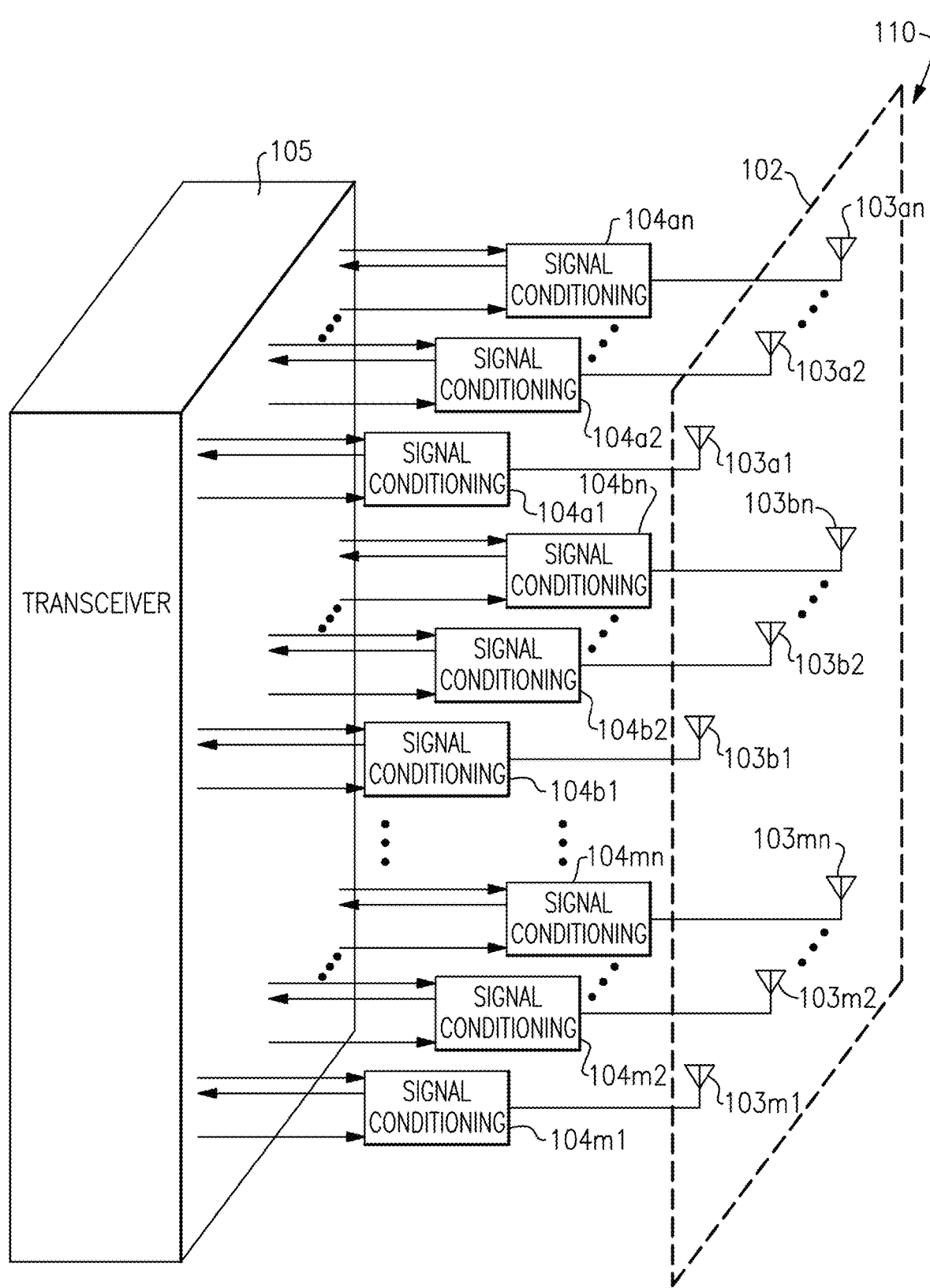

FIG. 4A is a schematic diagram of one example of a communication system that operates with beamforming.

Figure 4B:
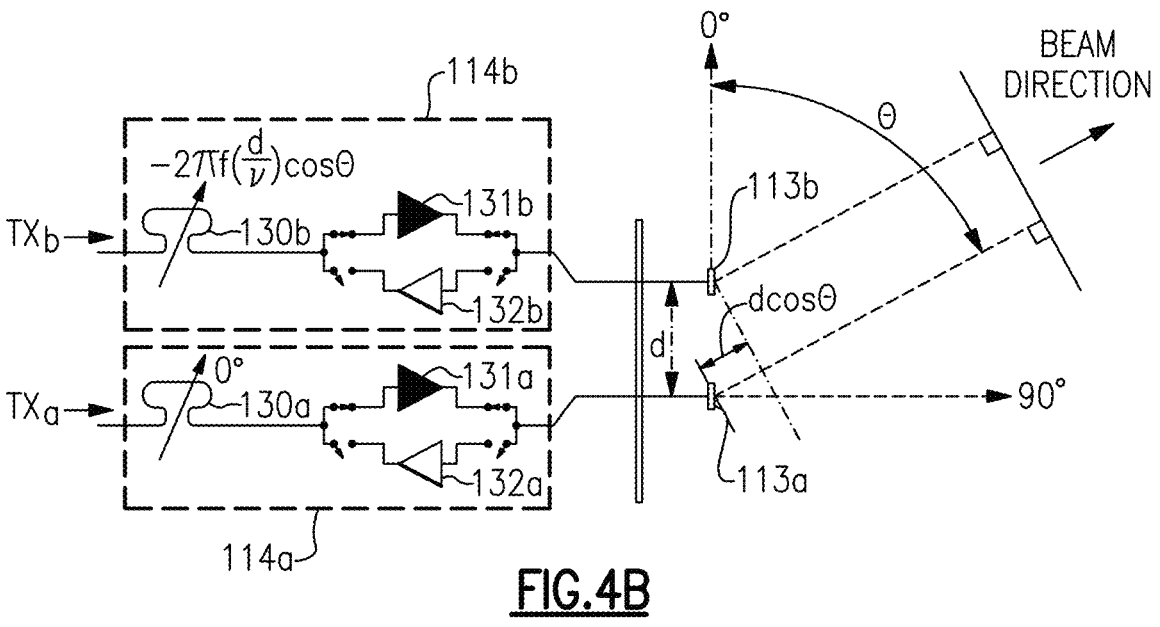

FIG. 4B is a schematic diagram of one example of beamforming to provide a transmit beam.

Figure 4C:
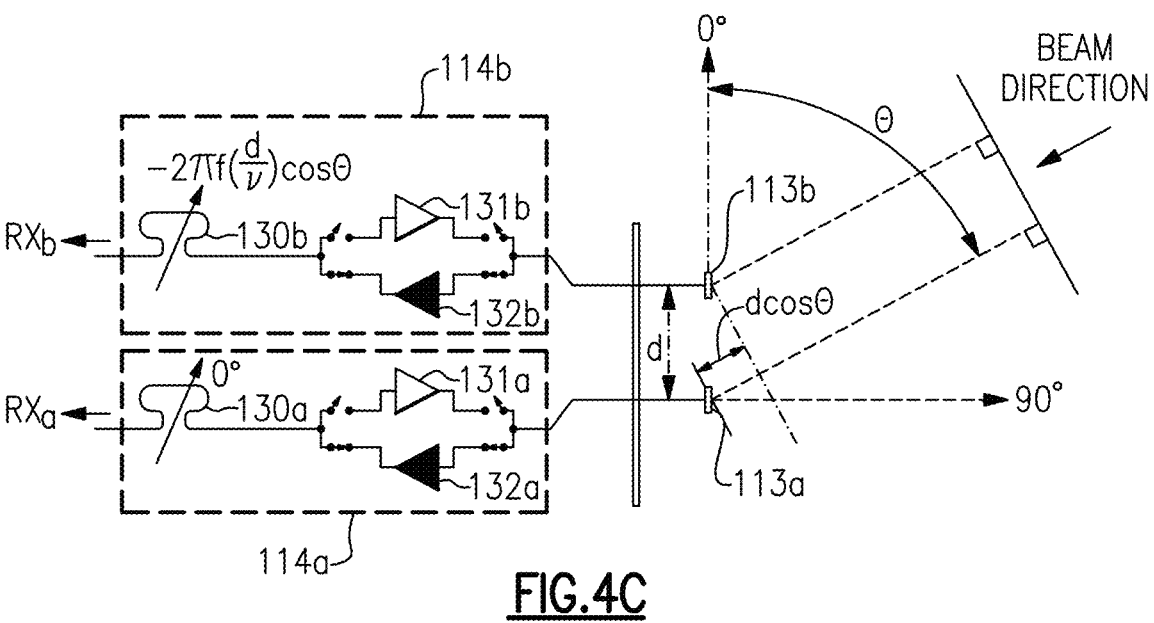

FIG. 4C is a schematic diagram of one example of beamforming to provide a receive beam.

Figure 5A:
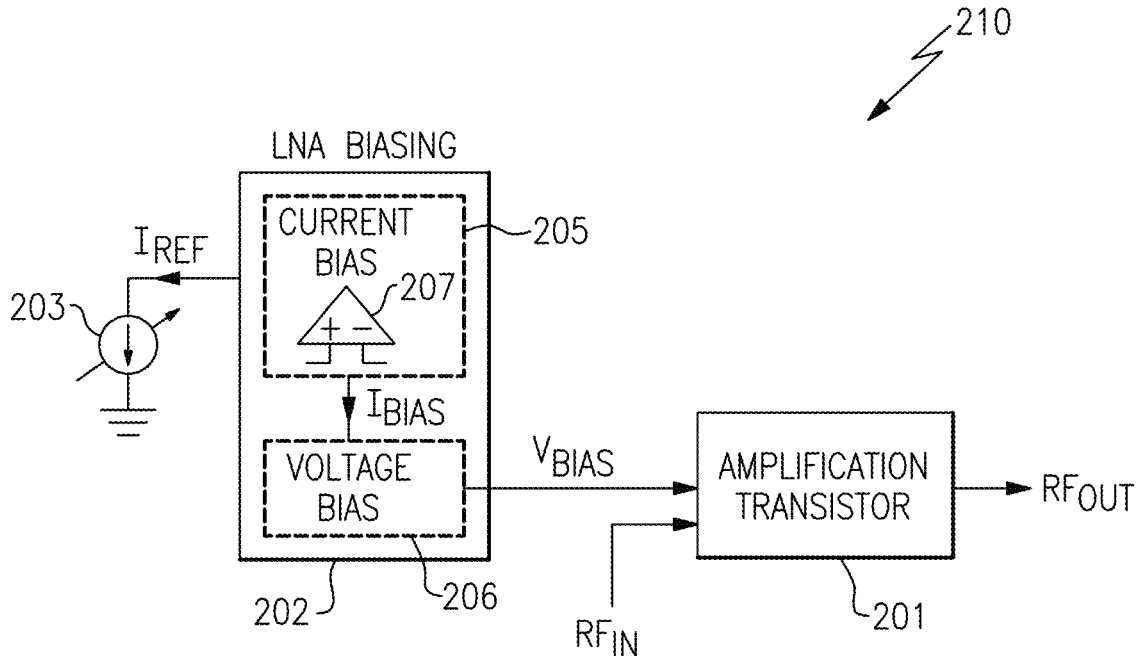

FIG. 5A is a schematic diagram of one embodiment of a low noise amplifier (LNA).

Figure 5B:
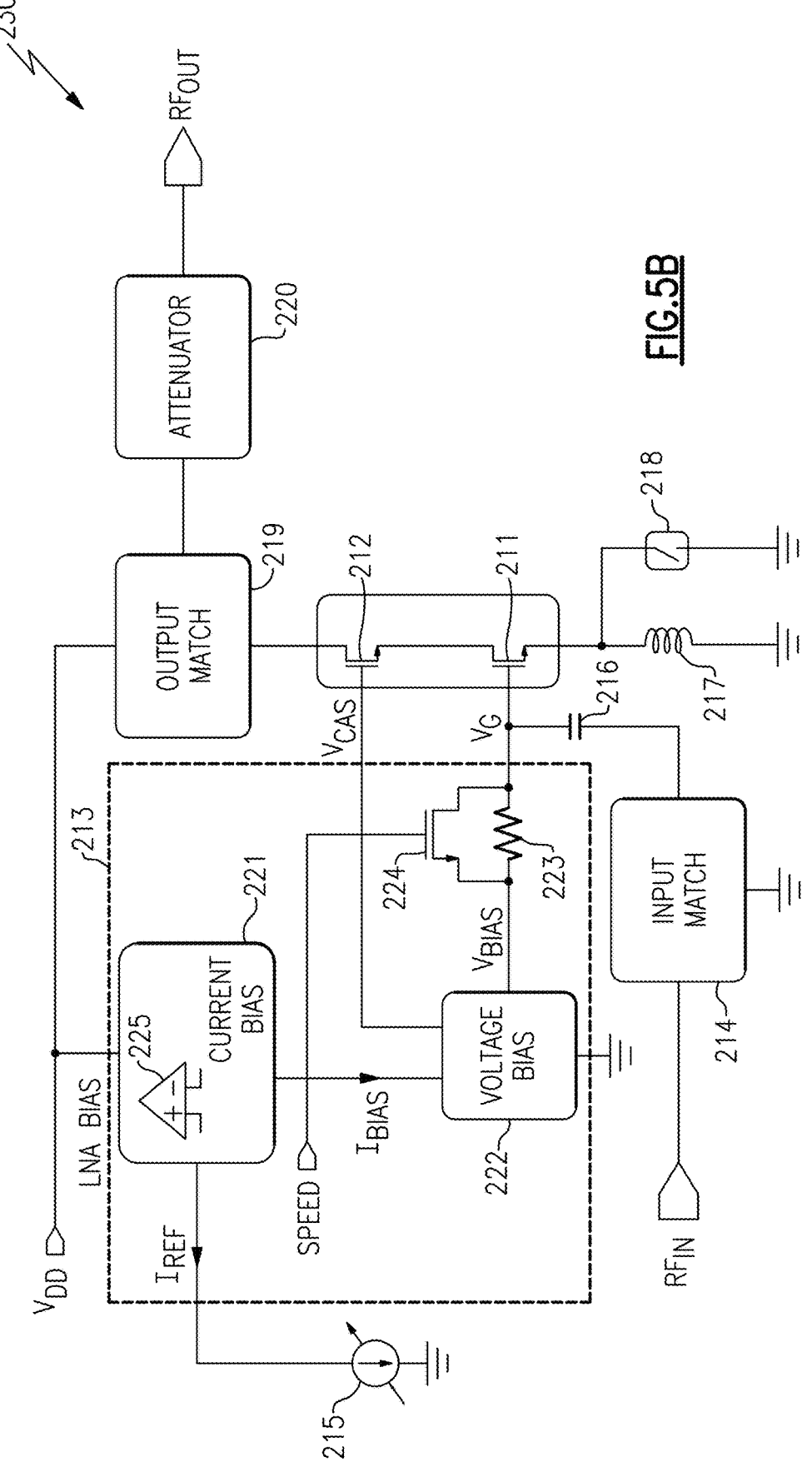

FIG. 5B is a schematic diagram of another embodiment of an LNA.

Figure 5C:
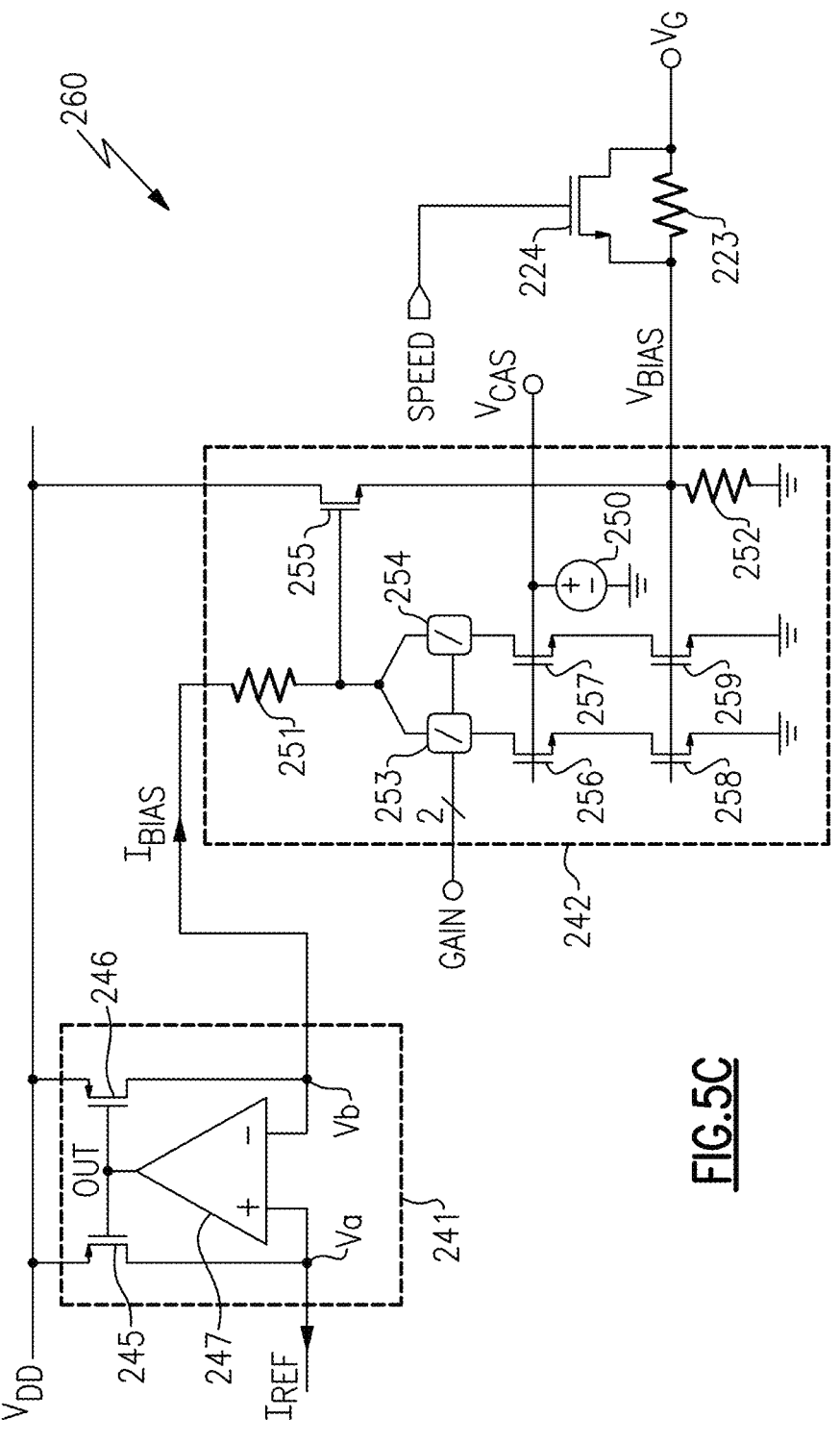

FIG. 5C is a schematic diagram of one embodiment of a biasing circuit for an LNA.

Figure 6A:
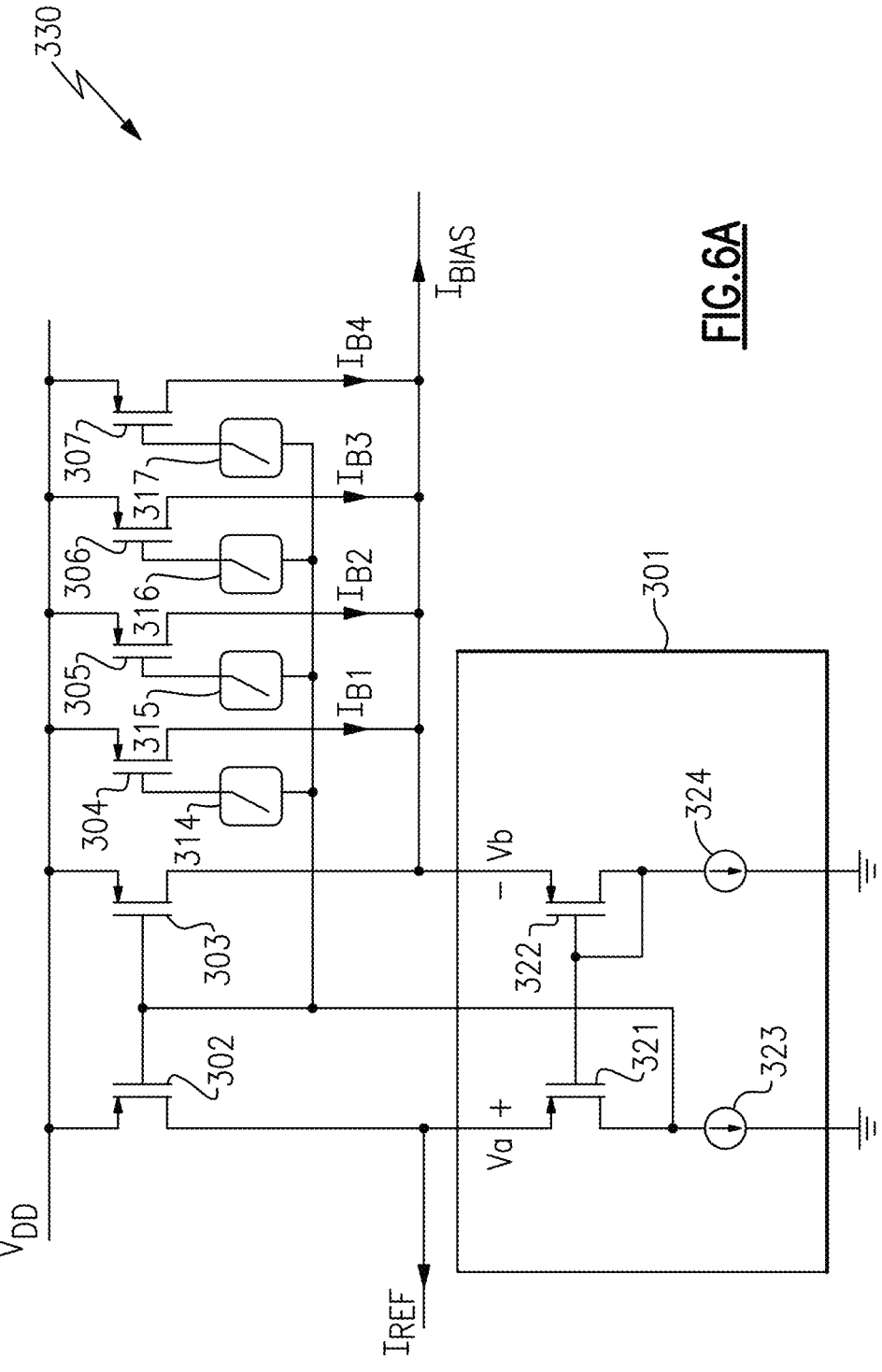

FIG. 6A is a schematic diagram of one embodiment of an LNA current bias circuit.

Figure 6B:
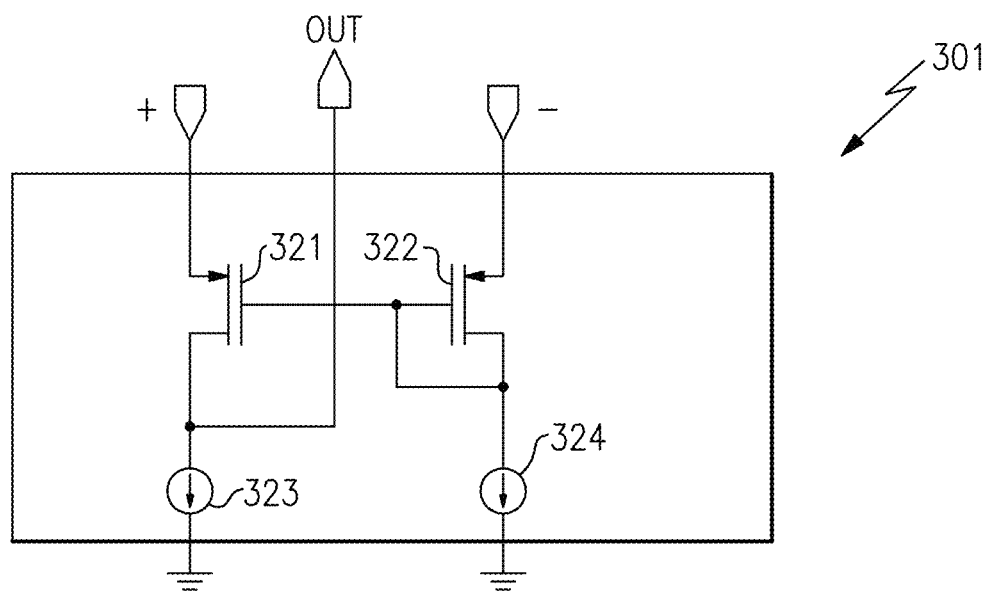

FIG. 6B is a schematic diagram of one embodiment of a servo amplifier for an LNA current bias circuit.

Figure 6C:
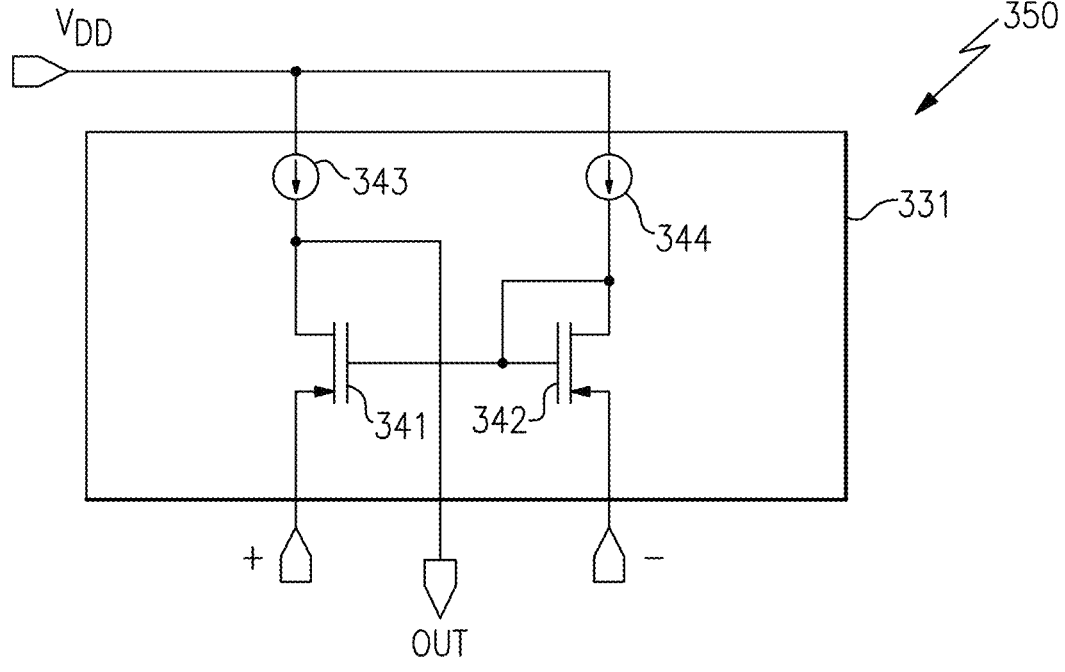

FIG. 6C is a schematic diagram of another embodiment of a servo amplifier for an LNA current bias circuit.

Figure 7:
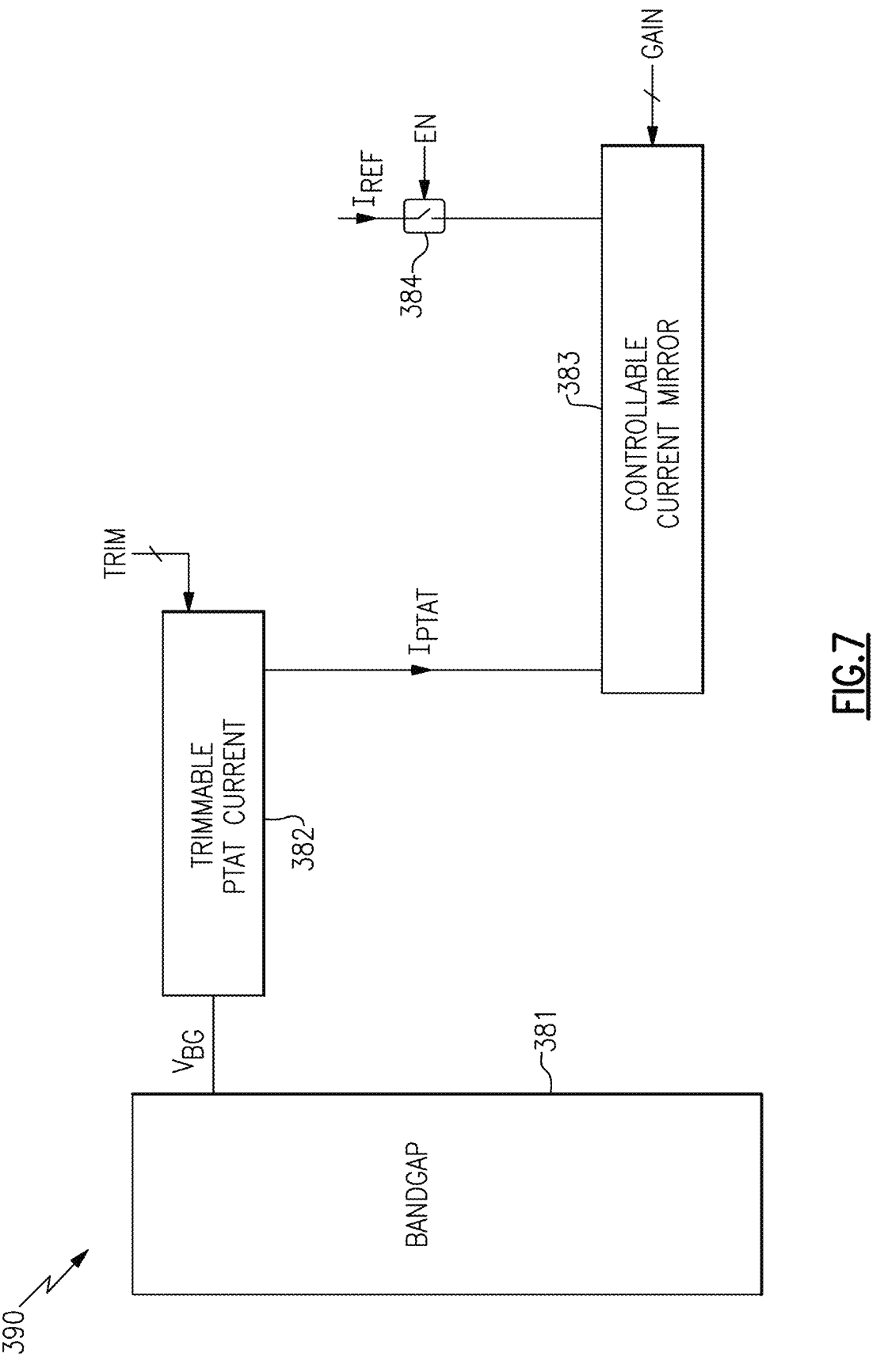

FIG. 7 is a schematic diagram of one embodiment of a controllable reference current source.

Figure 8:
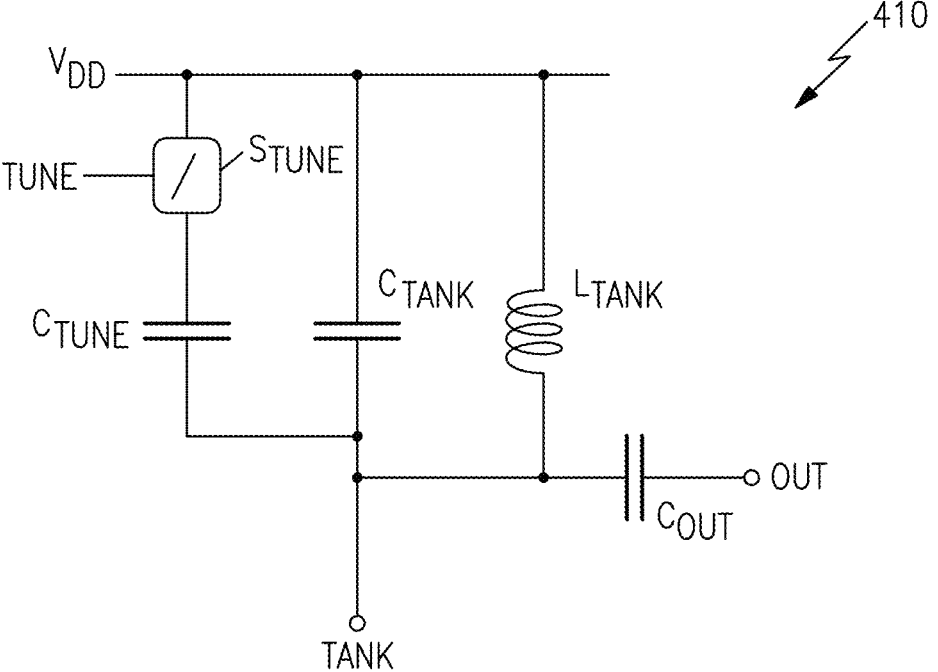

FIG. 8 is a schematic diagram of one embodiment of an output match circuit for an LNA.

Figure 9:
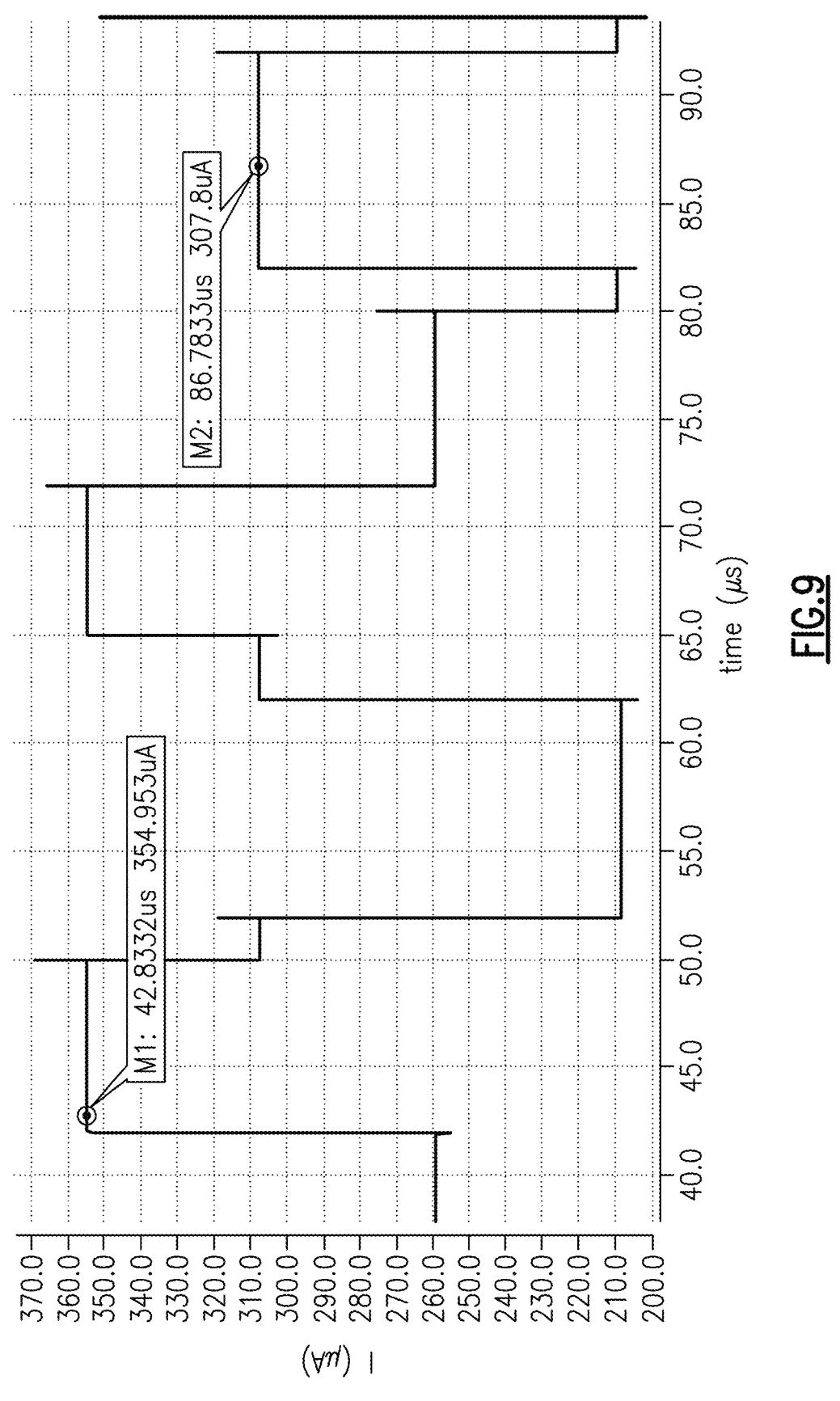

FIG. 9 is one example of a graph of current versus time for an LNA with fast biasing.

Figure 10:
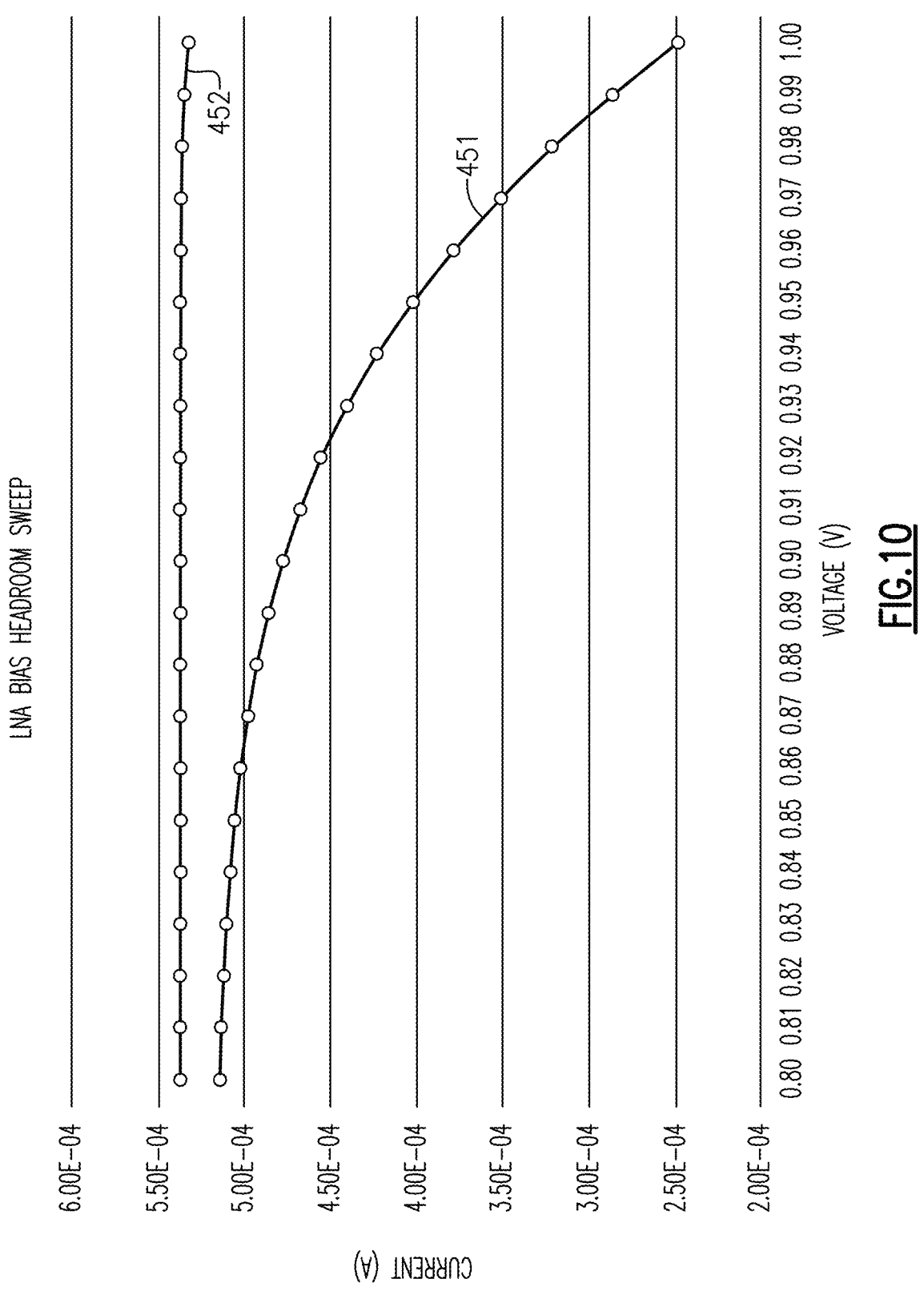

FIG. 10 is one example of a graph of voltage headroom for two implementations of LNAs.

Figure 11:
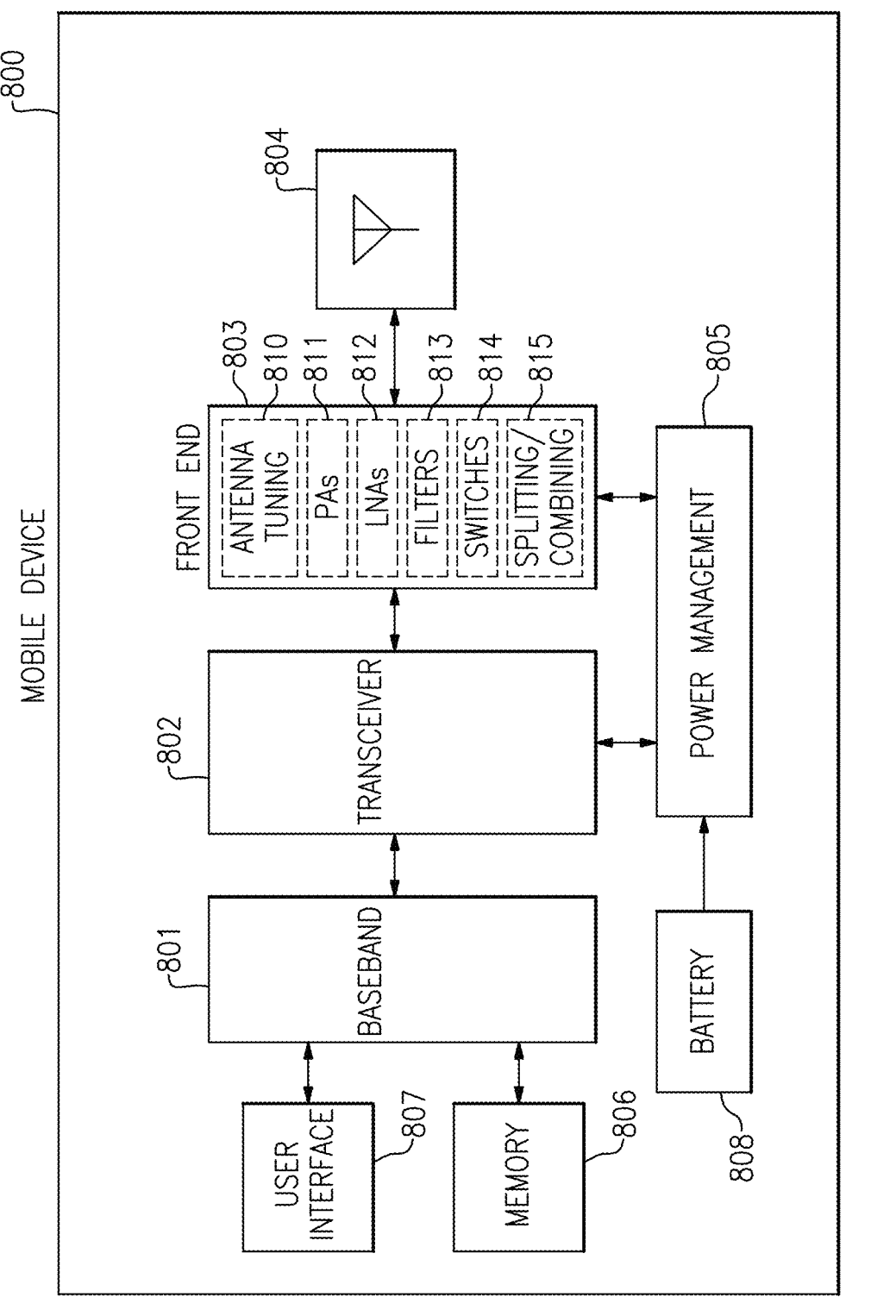

FIG. 11 is a schematic diagram of one embodiment of a mobile device.

Figure 12A:
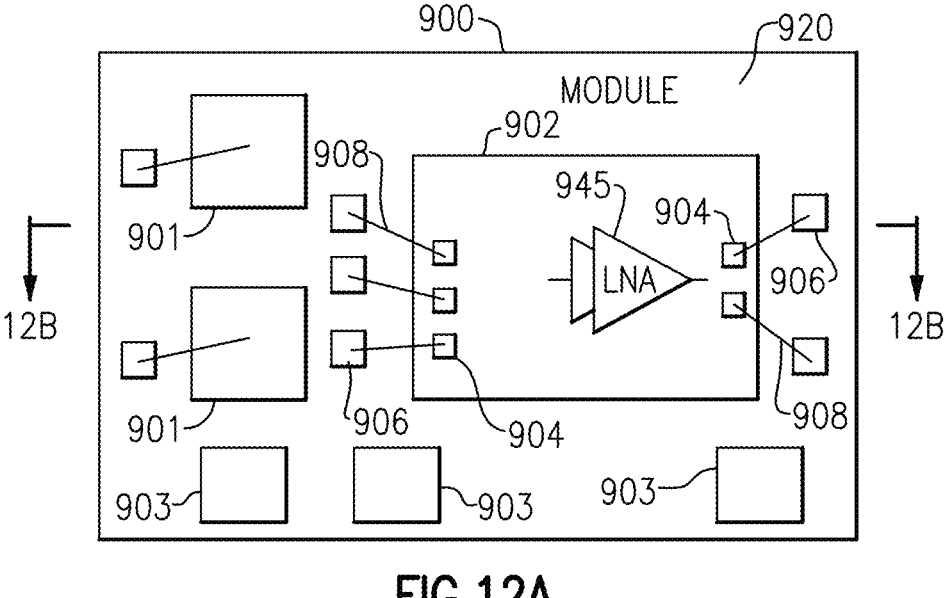

FIG. 12A is a schematic diagram of one embodiment of a packaged module.

Figure 12B:
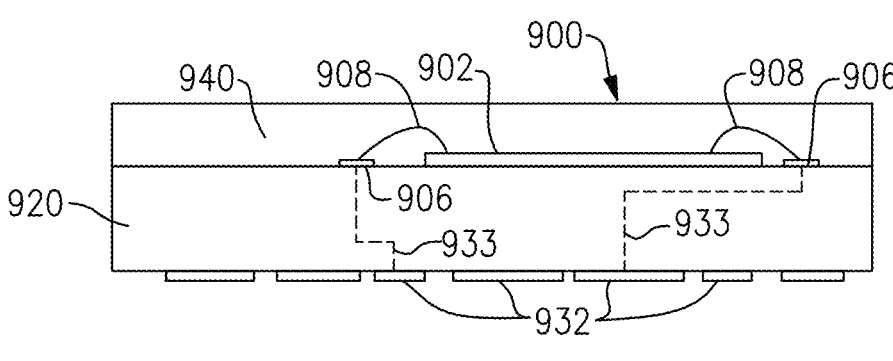

FIG. 12B is a schematic diagram of a cross-section of the packaged module of FIG. 12A taken along the lines 12B-12B.

DETAILED DESCRIPTION OF CERTAIN EMBODIMENTS

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the Euro- 5        6 pean Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Figure 1:
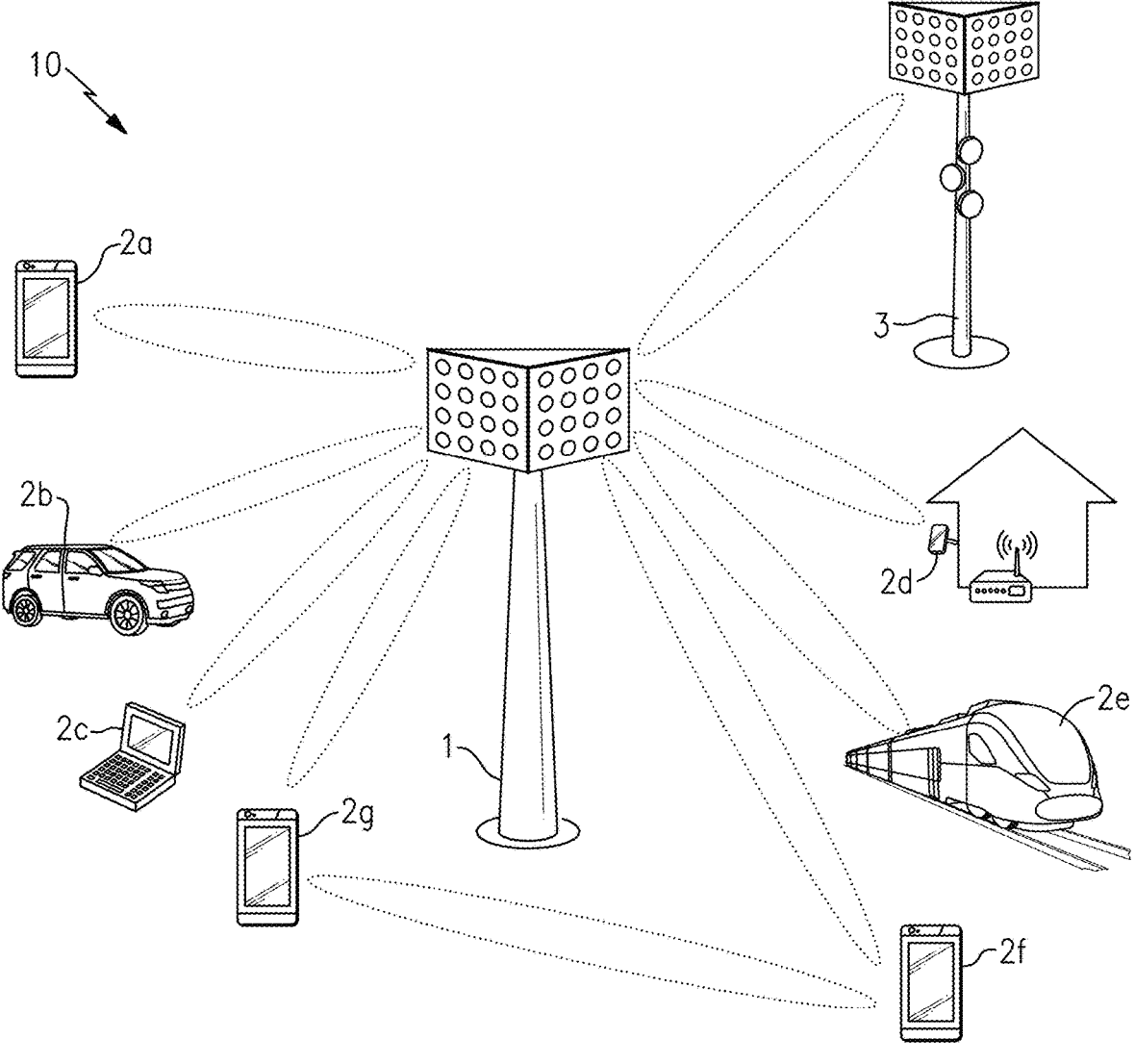
FIG. 1 is a schematic diagram of one example of a communication network.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
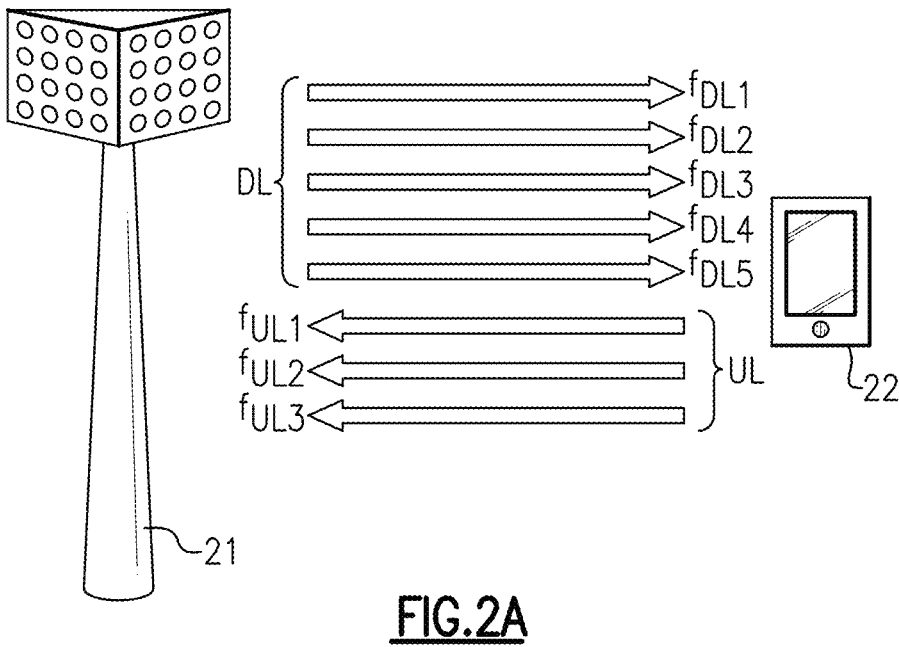
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
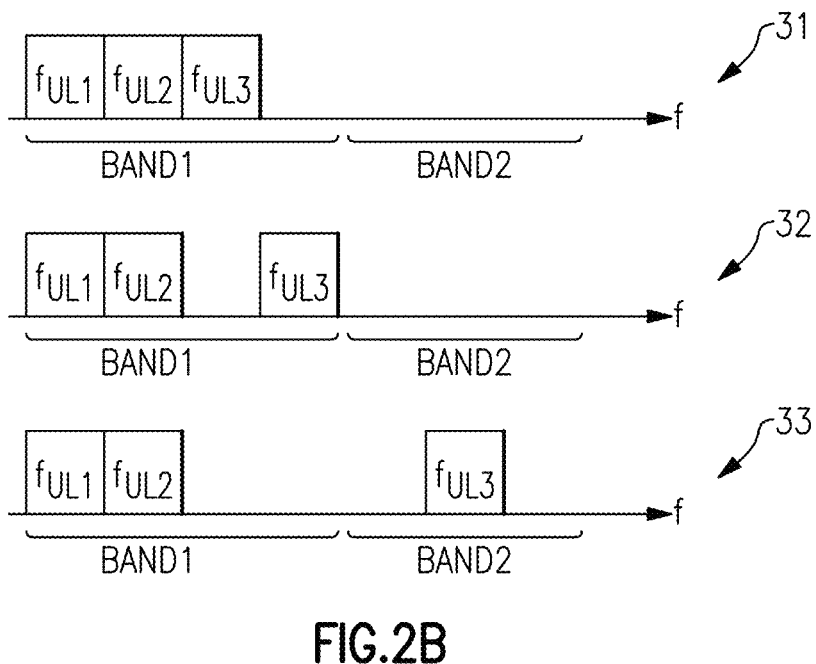
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
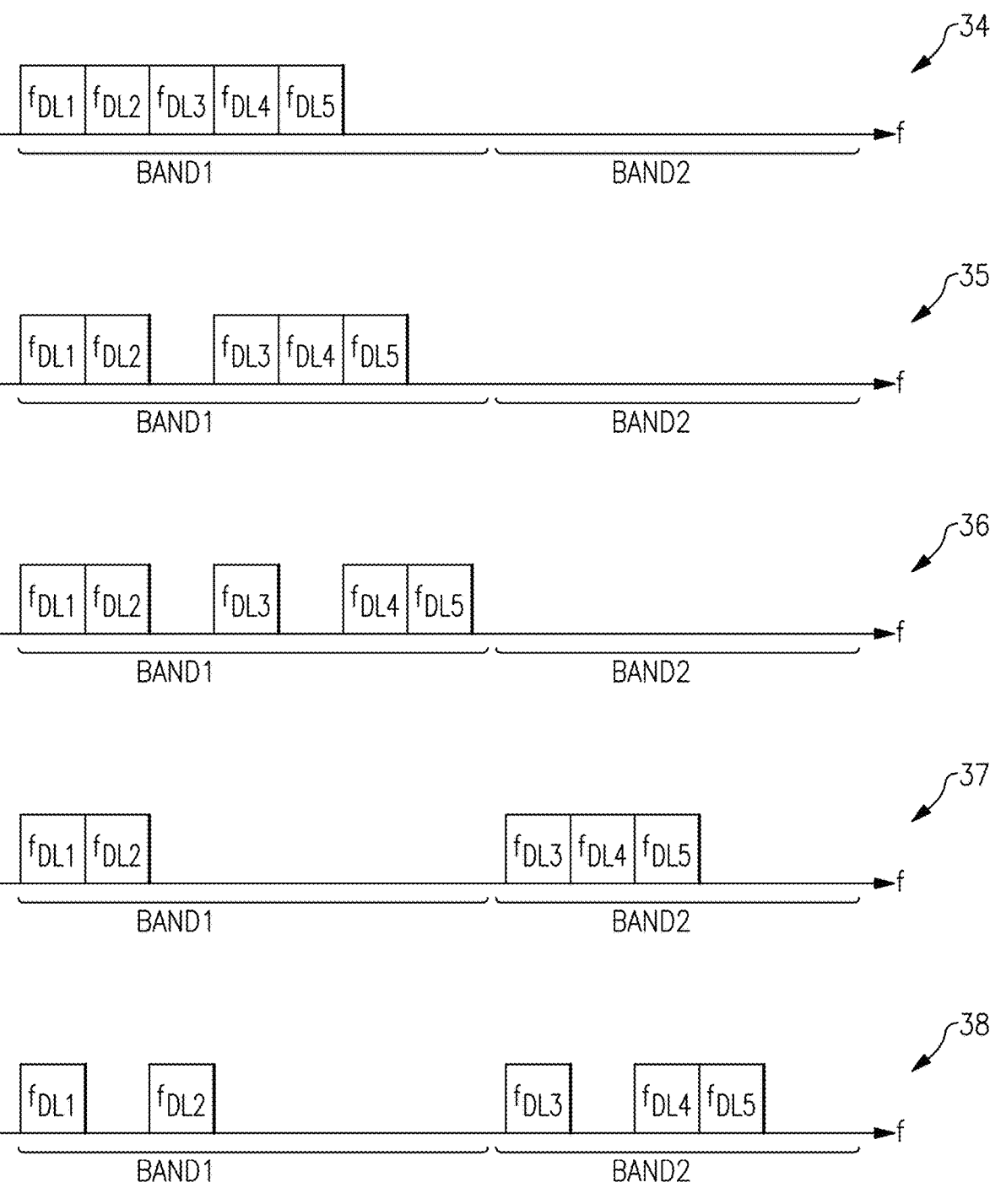
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

FIG. 4A is a schematic diagram of one example of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103*a*1, 103*a*2 . . . 103*an*, 103*b*1, 103*b*2 . . . 103*bn*, 103*m*1, 103*m*2 . . . 103*mn*.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 4A, the transceiver 105 generates control signals for the signal conditioning circuits. The control signals can be used for a variety of functions, such as controlling the gain and phase of transmitted and/or received signals to control beamforming.

FIG. 4B is a schematic diagram of one example of beamforming to provide a transmit beam. FIG. 4B illustrates a portion of a communication system including a first signal conditioning circuit 114*a*, a second signal conditioning circuit 114*b*, a first antenna element 113*a*, and a second antenna element 113*b*.

Although illustrated as included two antenna elements and two signal conditioning circuits, a communication system can include additional antenna elements and/or signal conditioning circuits. For example, FIG. 4B illustrates one embodiment of a portion of the communication system 110 of FIG. 4A.

The first signal conditioning circuit 114*a* includes a first phase shifter 130*a*, a first power amplifier 131*a*, a first low noise amplifier (LNA) 132*a*, and switches for controlling selection of the power amplifier 131*a* or LNA 132*a*. Additionally, the second signal conditioning circuit 114*b* includes a second phase shifter 130*b*, a second power amplifier 131*b*, a second LNA 132*b*, and switches for controlling selection of the power amplifier 131*b* or LNA 132*b*.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113*a* and the second antenna element 113*b* are separated by a distance d. Additionally, FIG. 4B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113*a*, 113*b*, a desired transmit beam angle θ can be achieved. For example, when the first phase shifter 130*a* has a reference value of 0°, the second phase shifter 130*b* can be controlled to provide a phase shift of about $-2\pi f(d/v)\cos\theta$ radians, where f is the fundamental frequency of the transmit signal, d is the distance between the antenna elements, v is the velocity of the radiated wave, and π is the mathematic constant pi.

In certain implementations, the distance d is implemented to be about $\frac{1}{2}\lambda$, where λ is the wavelength of the fundamental component of the transmit signal. In such implementations, the second phase shifter 130*b* can be controlled to provide a phase shift of about $-\pi\cos\theta$ radians to achieve a transmit beam angle θ.

Accordingly, the relative phase of the phase shifters 130*a*, 130*b* can be controlled to provide transmit beamforming. In certain implementations, a baseband processor and/or a transceiver (for example, the transceiver 105 of FIG. 4A) controls phase values of one or more phase shifters and gain values of one or more controllable amplifiers to control beamforming.

FIG. 4C is a schematic diagram of one example of beamforming to provide a receive beam. FIG. 4C is similar to FIG. 4B, except that FIG. 4C illustrates beamforming in the context of a receive beam rather than a transmit beam.

As shown in FIG. 4C, a relative phase difference between the first phase shifter 130*a* and the second phase shifter 130*b* can be selected to about equal to $-2\pi f(d/v)\cos\theta$ radians to achieve a desired receive beam angle θ. In implementations in which the distance d corresponds to about $\frac{1}{2}\lambda$, the phase difference can be selected to about equal to $-\pi\cos\theta$ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Examples of LNAs and LNA Biasing

Apparatus and methods for biasing of LNAs are provided herein. In certain embodiments, an LNA includes at least one transistor that amplifies a radio frequency (RF) input signal, and a bias circuit including a current bias circuit that generates a bias current based on a reference current and a voltage bias circuit that generates at least one input bias voltage for the at least one transistor based on the bias current. The current bias circuit includes a first bias transistor that receives the reference current, a second bias transistor that generates the bias current, and an amplifier that controls a first bias voltage of the first bias transistor to match a second bias voltage of the second bias transistor.

By implementing the LNA biasing in this manner, fast biasing, accurate matching of the bias current to the reference current, smaller circuit area, and/or superior voltage headroom is achieved.

FIG. 5A is a schematic diagram of one embodiment of an LNA 210. The LNA 210 includes an amplification transistor 201, a biasing circuit 202, and a reference current source 203.

As shown in FIG. 5A, the amplification transistor 201 amplifies an RF input signal $RF_{IN}$ to generate an RF output signal $RF_{OUT}$. Additionally, the amplification transistor 201 is biased by a bias voltage $V_{BIAS}$ generated by the biasing circuit 202. Although shown as including one amplification transistor 201, the LNA 210 can include one or more additional transistors that amplify the RF input signal $RF_{IN}$. For instance, in one example the LNA 210 is implemented as a cascode amplifier including a common-source transistor biased by a first bias voltage and a cascode transistor biased by a second bias voltage.

The reference current source 203 generates a reference current $I_{REF}$ that is provided to the biasing circuit 202. The reference current source 203 is controllable in this example. For instance, in one example the reference current $I_{REF}$ is digitally controllable to provide gain control (to adjust the amount of amplification the LNA provided to the RF input signal $RF_{IN}$) and/or trimming to account for variation, such as process, voltage, and/or temperature (PVT) variation.

With continuing reference to FIG. 5A, the biasing circuit 202 includes a current bias circuit 205 and a voltage bias circuit 206. The current bias circuit 205 generates a bias current $I_{BIAS}$ based on the reference current $I_{REF}$, while the voltage bias circuit 206 generates the bias voltage $V_{BIAS}$ based on the bias current $I_{BIAS}$.

In certain implementations, the current bias circuit 205 includes a first bias transistor that receives the reference current $I_{REF}$, a second bias transistor that generates the bias current $I_{BIAS}$, and an amplifier 207 that controls a first bias voltage of the first bias transistor to match a second bias voltage of the second bias transistor. By implementing the current bias circuit 205 in this manner, accurate matching of the bias current $I_{BIAS}$ to the reference current $I_{REF}$ is achieved. Moreover, such accurate matching can be achieved without the use of cascode transistors in the current bias circuit, thereby achieving smaller area and/or superior voltage headroom that permits the LNA 210 to operate at low supply voltage levels.

Furthermore, including the amplifier 207 allows the bias current $I_{BIAS}$ to quickly reach a steady-state level after enabling the LNA 210, thereby providing the LNA 210 with fast biasing. Such speed in providing proper bias allows the LNA 210 to be quickly turned on or off, which is particularly advantageous in 5G applications associated with short time windows for transitioning between a transmit frame and a receive frame for 5G NR TDD bands.

FIG. 5B is a schematic diagram of another embodiment of an LNA 230. The LNA 230 includes a common-source field-effect transistor (FET) 211, a cascode FET 212, a biasing circuit 213, an input match circuit 214, a reference current source 215, a DC blocking capacitor 216, a degeneration inductor 217, a degeneration bypass switch 218, an output match circuit 219, and an attenuator 220. The LNA 230 receives a power supply voltage $V_{DD}$ and a ground voltage (ground), and serves to amplify an RF input signal $RF_{IN}$ to generate an RF output signal $RF_{OUT}$.

As shown in FIG. 5B, the common source FET 211 includes a gate that receives RF input signal $RF_{IN}$ by way of the input match circuit 214 and the DC blocking capacitor 216. The gate voltage $V_G$ of the common source FET 211 is also biased by a gate bias voltage $V_{BIAS}$ from the biasing circuit 213. The degeneration inductor 217 and the degeneration bypass switch 218 are connected in parallel between a source of the common source FET 211 and ground, and serve to provide a controllable amount of source degeneration (inductive degeneration) to the common source FET 211. The cascode FET 212 is connected between the output match circuit 219 and a drain of the common source FET 211, and includes a gate biased by as cascode bias voltage $V_{CAS}$ generated by the biasing circuit 213.

With continuing reference to FIG. 5B, the attenuator 220 provides a controllable amount of attenuation to an RF signal provided by the output match circuit 219 to generate the RF output signal $RF_{OUT}$ of the LNA 230. In certain implementations, the attenuator 220 is implemented as a digital-step attenuator (DSA) that provides one mechanism for gain control. Although the attenuator 220 can provide some degree of gain control, other components of the LNA 230 (for instance, the reference current source 215 and/or the biasing circuit 213) also provide gain control. Thus, multiple mechanisms can be provided for controlling the amount of amplification provided by the LNA 230.

The reference current source 215 generates the reference current $I_{REF}$, which is provided to the biasing circuit 213, in this embodiment. The reference current source 215 is controllable, in this example.

In the illustrated embodiment, the biasing circuit 213 includes a current bias circuit 221, a voltage bias circuit 222, a bias resistor 223, and a resistor bypass switch 224. The current bias circuit 221 generates a bias current $I_{BIAS}$ based on the reference current $I_{REF}$. In some implementations, the current bias circuit 221 includes a first bias transistor that receives the reference current $I_{REF}$, a second bias transistor that generates the bias current $I_{BIAS}$, and an amplifier 225 that controls a first bias voltage of the first bias transistor to match a second bias voltage of the second bias transistor.

With continuing reference to FIG. 5B, the voltage bias circuit 222 generates a gate bias voltage $V_{BIAS}$ and a cascode bias voltage $V_{CAS}$ with at least the gate bias voltage $V_{BIAS}$ being based on the bias current $I_{BIAS}$. The cascode bias voltage $V_{CAS}$ is provided to the gate of the cascode FET 212. Additionally, the gate bias voltage $V_{BIAS}$ is provided to the gate of the common source FET 211 by way of the parallel combination of the bias resistor 223 and the resistor bypass switch 224. In some implementations, both the gate bias voltage $V_{BIAS}$ and the cascode bias voltage $V_{CAS}$ have voltage levels that change based on the current level of the bias current $I_{BIAS}$.

As shown in FIG. 5B, the resistor bypass switch 224 is controlled by a speed control signal (SPEED), which can be selectively activated to reduce the amount of resistance between the voltage bias circuit 222 and the gate of the common-source FET 211. Accordingly, a resistor-capacitor (RC) time constant associated with charging or discharging the gate of the common source FET 211 can be selectively reduced by activing the speed control signal. By implementing the LNA biasing in this manner, the benefits of fast gate bias control and high biasing isolation are achieved.

FIG. 5C is a schematic diagram of one embodiment of a biasing circuit 260 for an LNA, such as the LNA 230 of FIG. 5B. The biasing circuit 260 receives a power supply voltage $V_{DD}$, a ground voltage, a speed control signal (SPEED), a gain control signal (GAIN), and a reference current $I_{REF}$. The biasing circuit 260 generates a gate bias voltage $V_{BIAS}$, which is used to control a gate voltage $V_G$ of a common source FET. The biasing circuit 260 also generates a cascode bias voltage $V_{CAS}$ used to bias a cascode FET.

In the illustrated embodiment, the biasing circuit 260 includes a current bias circuit 241, a voltage bias circuit 242, a bias resistor 223, and a resistor bypass switch 224. The current bias circuit 241 receives the reference current $I_{REF}$ and generates the bias current $I_{BIAS}$. The current bias circuit 241 includes a first bias FET 245 that receives the reference current $I_{REF}$, a second bias FET 246 that generates the bias current $I_{BIAS}$, and a servo amplifier 247 that controls a first bias voltage Va of the first bias FET 245 to match a second bias voltage Vb of the second bias FET 246. In this embodiment, a first input (+) of the servo amplifier 247 receives the first bias voltage Va, a second input (−) of the servo amplifier 247 receives the second bias voltage Vb, and an output of the servo amplifier 247 controls the gates of the first bias FET 245 and the second bias FET 246 to provide feedback that matches of the drain-to-source voltages of the first bias FET 245 and the second bias FET 246 to one another.

By including the servo amplifier 247, accurate matching of the bias current $I_{BIAS}$ to the reference current $I_{REF}$ is achieved. Moreover, the current bias circuit 241 has excellent voltage headroom that allows the power supply voltage $V_{DD}$ to operate at a low voltage level. Furthermore, the servo amplifier 247 quickly sets the gate voltages of the first bias FET 245 and the second bias FET 246 to a proper biasing level, and thus provides fast biasing that allows an LNA to be quickly turned on or off, which is desirable for TDD applications with a short time windows for transitioning between a transmit frame and a receive frame.

With continuing reference to FIG. 5C, the current bias circuit 242 includes a voltage source 250, a first biasing resistor 251, a second biasing resistor 252, a first gain control switch 253, a second gain control switch 254, a first biasing FET 255, a second biasing FET 256, a third biasing FET 257, a fourth biasing FET 258, and a fifth biasing FET 259. The bias current $I_{BIAS}$ flows through the first biasing resistor 251 to control a gate voltage of the first biasing FET 255, which provides a current that flows through the second biasing resistor 252 to set the bias voltage $V_{BIAS}$ The bias current $I_{BIAS}$ also flows through the series combination of the second biasing FET 256 and the fourth biasing FET 258 and/or the series combination of the third biasing FET 257 and the fifth biasing FET 259 based on the setting of the first gain control switch 253 and the second gain control switch 254 (controlled by the gain control signal GAIN).

Although not depicted in FIG. 5C, a wide variety of biasing schemes (for instance, feedback schemes) can be used to control a voltage level of the voltage source 250 to set the gate voltage of the second biasing FET 256 and the third biasing FET 257 (and thus the cascode bias voltage $V_{CAS}$) based on the amount of current flowing therethrough (corresponding to $I_{BIAS}$).

The gate bias voltage $V_{BIAS}$ is used to control the gate voltage $V_G$ through the parallel combination of the bias resistor 223 and the resistor bypass switch 224. The resistor bypass switch 224 is controlled by the speed control signal (SPEED).

FIG. 6A is a schematic diagram of one embodiment of an LNA current bias circuit 330. The current bias circuit 330 includes a servo amplifier 301, a first biasing FET 302, a second biasing FET 303, a first selectable mirroring FET 304, a second selectable mirroring FET 305, a third selectable mirroring FET 306, a fourth selectable mirroring FET 307, a first selection switch 314, a second selection switch 315, a third selection switch 316, and a fourth selection switch 317.

As shown in FIG. 6A, the first bias FET 302 receives the reference current $I_{REF}$, the second bias FET 303 generates the bias current $I_{BIAS}$, and the servo amplifier 301 controls a first bias voltage Va of the first bias FET 302 to match a second bias voltage Vb of the second bias FET 303. Additionally, a first input (+) of the servo amplifier 301 receives the first bias voltage Va, a second input (−) of the servo amplifier 301 receives the second bias voltage Vb, and an output of the servo amplifier 301 controls the gates of the first bias FET 302 and the second bias FET 303 to provide feedback that matches the drain-to-source voltage of the first bias FET 302 to the drain-to-source voltage of the second bias FET 303.

The selectable mirroring FETs 304-307 can be selectively activated by the selection switches 314-317, respectively, to increase the bias current $I_{BIAS}$ to provide gain control. Thus, currents $I_{B1}$, $I_{B2}$, $I_{B3}$, and/or $I_{B4}$ generated by the mirroring FETs 304-307, respectively, can be selectively added to the current generated by the second bias FET 303. When activated, the selectable mirroring FETs 304-307 operate with the same gate-to-source and source-to-drain voltages as the second bias FET 303 due to the feedback provided by the servo amplifier 301.

In the illustrated embodiment, the servo amplifier 301 includes a first amplifier FET 321, a second amplifier FET 322, a first current source 323, and a second current source 324. However, other implementations are possible.

FIG. 6B is a schematic diagram of one embodiment of a servo amplifier 301 for an LNA current bias circuit. The servo amplifier 301 includes a first amplifier FET 321, a second amplifier FET 322, a first current source 323, and a second current source 324. The first amplifier FET 321 and the second amplifier FET 322 are p-type, in this example.

FIG. 6C is a schematic diagram of another embodiment of a servo amplifier 350 for an LNA current bias circuit. The servo amplifier 350 includes a first amplifier FET 341, a second amplifier FET 342, a first current source 343, and a second current source 344. The first amplifier FET 341 and the second amplifier FET 342 are n-type, in this example. The servo amplifier 350 of FIG. 6C corresponds to a complementary implementation of the servo amplifier 301 of FIG. 6B in which a transistor polarity is reversed.

FIG. 7 is a schematic diagram of one embodiment of a controllable reference current source 390. The controllable reference current source 390 includes a bandgap circuit 381, a trimmable proportional to absolute temperature (PTAT) current source 382, a controllable current mirror 383, and an enable switch 384.

The bandgap circuit 381 generates a bandgap voltage $V_{BG}$ used to bias the trimmable PTAT current source 382. The trimmable PTAT current source 382 generates a PTAT current $I_{PTAT}$, which is trimmable by a trimming control signal TRIM (a multi-bit digital signal, in this example) to provide enhanced accuracy. The controllable current mirror 383 mirrors the PTAT current $I_{PTAT}$ to generate a reference current $I_{REF}$ that is provided at an output when the enable switch 384 is activated by an enable signal EN. The controllable current mirror 383 has a controllable gain set by a gain control signal GAIN (a multi-bit digital signal, in this example).

FIG. 8 is a schematic diagram of one embodiment of an output match circuit 410 for an LNA. The output match circuit 410 includes a tank capacitor $C_{TANK}$, a tank inductor $L_{TANK}$, a tuning capacitor $C_{TUNE}$, a tuning switch $S_{TUNE}$, and an output capacitor $C_{OUT}$. The output match circuit 410 includes a tank node TANK for connecting to one or more amplification transistors of an LNA, and an output node OUT for providing an output signal.

As shown in FIG. 8, the tank capacitor $C_{TANK}$ and the tank inductor $L_{TANK}$ are connected in parallel between the output node OUT and a supply voltage $V_{DD}$. Additionally, when the tuning switch $S_{TUNE}$ is activated (closed), the tuning capacitor $C_{TUNE}$ is in parallel with the tank capacitor $C_{TANK}$ to adjust the amount of tank capacitance. The output capacitor $C_{OUT}$ is connected between the tank node TANK and the output node OUT.

FIG. 9 is one example of a graph of current versus time for an LNA with fast biasing The graph corresponds to one implementation of the LNA 230 of FIG. 5B. As shown in FIG. 9, the bias current is quickly adjustable in response to changes in the bias current setting.

FIG. 10 is one example of a graph of voltage headroom for two implementations of LNAs. The graph includes a first plot 451 of bias current versus headroom voltage for an LNA without using a servo amplifier, and a second plot 452 of bias current versus headroom voltage for one implementation of an LNA using a servo amplifier. For the first plot 451, 0.86V is the highest headroom to maintain above 500 μA bias current, while for the second plot 452 the proper bias current is maintained even under 1V of headroom.

FIG. 11 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 11 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible. The LNAs 812 can include one or more LNAs implemented in accordance with the teachings herein.

The front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 11, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 11, the power management system 805 receives a battery voltage from the battery 808. The battery 808 can be any suitable battery for use in the mobile device 800, including, for example, a lithium-ion battery.

FIG. 12A is a schematic diagram of one embodiment of a packaged module 900. FIG. 12B is a schematic diagram of a cross-section of the packaged module 900 of FIG. 12A taken along the lines 12B-12B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a low noise amplifier 945, which can be implemented in accordance with one or more features disclosed herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 12B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 12B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Applications

The principles and advantages of the embodiments herein can be used for any other systems or apparatus that have needs for low noise amplification. Examples of such apparatus include RF communication systems. RF communications systems include, but are not limited to, mobile phones, tablets, base stations, network access points, customer-premises equipment (CPE), laptops, and wearable electronics. Thus, the low noise amplifiers herein can be included in various electronic devices, including, but not limited to, consumer electronic products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:

an antenna; and a front-end system that includes a low noise amplifier including a common source transistor configured to amplify a radio frequency input signal received from the antenna, and a biasing circuit including a current bias circuit configured to generate a bias current based on a reference current and a voltage bias circuit configured to generate a gate bias voltage for a gate of the common source transistor based on the bias current, the current bias circuit including a first bias transistor configured to receive the reference current, a second bias transistor configured to generate the bias current, and an amplifier configured to control a first bias voltage of the first bias transistor to match a second bias voltage of the second bias transistor, the first bias transistor including a drain connected to a first input of the amplifier and a gate connected to an output of the amplifier, and the second bias transistor including a drain connected to a second input of the amplifier and a gate connected to the output of the amplifier, the voltage bias circuit including a first voltage bias transistor, a first resistor connected between the second input of the amplifier and a gate of the first voltage bias transistor, and a second resistor connected between a source of the first voltage bias transistor and a ground voltage, the source of the first voltage bias transistor configured to generate the gate bias voltage.

2. The mobile device of claim 1 wherein the current bias circuit further includes a plurality of selection switches and a plurality of current mirroring transistors each selectable by a corresponding one of the plurality of selection switches, the plurality of current mirroring transistors biased by the second bias voltage.

3. The mobile device of claim 1 wherein the biasing circuit includes a bias resistor and a bias resistor bypass switch, the voltage bias circuit configured to provide the gate bias voltage to the gate of the common source transistor through a parallel combination of the bias resistor and the bias resistor bypass switch.

4. The mobile device of claim 1 wherein the low noise amplifier further includes a cascode transistor in series with the common source transistor, the voltage bias circuit further configured to generate a cascode bias voltage for a gate of the cascode transistor.

5. The mobile device of claim 1 wherein the front-end system further includes a controllable current source configured to generate the reference current, the controllable current source configured to control the reference current based on a gain control signal.

6. The mobile device of claim 4 wherein the voltage bias circuit further includes a second voltage bias transistor and a third voltage bias transistor in series between a gate of the first voltage bias transistor and the ground voltage.

7. The mobile device of claim 6 wherein the voltage bias circuit is configured to generate the cascode bias voltage based on a gate voltage of the second voltage bias transistor.

8. The mobile device of claim 1 wherein first bias transistor further includes a source connected to a supply voltage, and the second bias transistor further includes a source connected to a supply voltage.

9. A low noise amplifier comprising:
a common source transistor configured to amplify a radio frequency input signal; and
a biasing circuit including a current bias circuit configured to generate a bias current based on a reference current and a voltage bias circuit configured to generate a gate bias voltage for a gate of the common source transistor based on the bias current, the current bias circuit including a first bias transistor configured to receive the reference current, a second bias transistor configured to generate the bias current, and an amplifier configured to control a first bias voltage of the first bias transistor to match a second bias voltage of the second bias transistor, the first bias transistor including a drain connected to a first input of the amplifier and a gate connected to an output of the amplifier, and the second bias transistor including a drain connected to a second input of the amplifier and a gate connected to the output of the amplifier, the voltage bias circuit including a first voltage bias transistor, a first resistor connected between the second input of the amplifier and a gate of the first voltage bias transistor, and a second resistor connected between a source of the first voltage bias transistor and a ground voltage, the source of the first voltage bias transistor configured to generate the gate bias voltage.

10. The low noise amplifier of claim 9 wherein the current bias circuit further includes a plurality of selection switches and a plurality of current mirroring transistors each selectable by a corresponding one of the plurality of selection switches, the plurality of current mirroring transistors biased by the second bias voltage.

11. The low noise amplifier of claim 9 wherein the biasing circuit includes a bias resistor and a bias resistor bypass switch, the voltage bias circuit configured to provide the gate bias voltage to the gate of the common source transistor through a parallel combination of the bias resistor and the bias resistor bypass switch.

12. The low noise amplifier of claim 9 further comprising a cascode transistor in series with the common source transistor, the voltage bias circuit further configured to generate a cascode bias voltage for a gate of the cascode transistor.

13. The low noise amplifier of claim 9 further comprising a controllable current source configured to generate the reference current, the controllable current source configured to control the reference current based on a gain control signal.

14. The low noise amplifier of claim 12 wherein the voltage bias circuit further includes a second voltage bias transistor and a third voltage bias transistor in series between a gate of the first voltage bias transistor and the ground voltage.

15. The low noise amplifier of claim 14 wherein the voltage bias circuit is configured to generate the cascode bias voltage based on a gate voltage of the second voltage bias transistor.

16. The low noise amplifier of claim 9 wherein first bias transistor further includes a source connected to a supply voltage, and the second bias transistor further includes a source connected to a supply voltage.

17. A method of radio frequency signal amplification, the method comprising:
amplifying a radio frequency input signal using a common source transistor of a low noise amplifier;
generating a gate bias voltage of the common source transistor based on a bias current using a voltage bias circuit of the low noise amplifier; and
generating the bias current based on a reference current using a current bias circuit of the low noise amplifier, including receiving the reference current using a first bias transistor, generating the bias current using a second bias transistor, and controlling a first bias voltage of the first bias transistor to match a second bias voltage of the second bias transistor using an amplifier, the first bias transistor including a drain connected to a first input of the amplifier and a gate connected to an output of the amplifier, and the second bias transistor including a drain connected to a second input of the amplifier and a gate connected to the output of the amplifier, the voltage bias circuit including a first voltage bias transistor, a first resistor connected between the second input of the amplifier and a gate of the first voltage bias transistor, and a second resistor connected between a source of the first voltage bias transistor and a ground voltage, the source of the first voltage bias transistor generating the gate bias voltage.

18. The method of claim 17 further comprising generating a cascode bias voltage for a cascode transistor that is in series with the common source transistor.

19. The method of claim 18 wherein the voltage bias circuit further includes a second voltage bias transistor and a third voltage bias transistor in series between a gate of the first voltage bias transistor and the ground voltage, the method further comprising generating the cascode bias voltage based on a gate voltage of the second voltage bias transistor.

20. The method of claim 17 wherein the biasing circuit includes a bias resistor and a bias resistor bypass switch, the method further comprising providing the gate bias voltage to the gate of the common source transistor through a parallel combination of the bias resistor and the bias resistor bypass switch.

\* \* \* \* \*